(12) United States Patent
Okuyama et al.

(10) Patent No.: US 7,099,208 B2
(45) Date of Patent: Aug. 29, 2006

(54) SEMICONDUCTOR MEMORY AUTOMATICALLY CARRYING OUT REFRESH OPERATION

(75) Inventors: Yoshiaki Okuyama, Kawasaki (JP); Kaoru Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/011,114

(22) Filed: Dec. 15, 2004

(65) Prior Publication Data
US 2005/0254321 A1 Nov. 17, 2005

(30) Foreign Application Priority Data
May 14, 2004 (JP) .............................. 2004-144905

(51) Int. Cl.
*G11C 7/00* (2006.01)
(52) U.S. Cl. ...................... 365/200; 365/222; 365/233; 365/236
(58) Field of Classification Search ................ 365/200, 365/222, 233, 236
See application file for complete search history.

(56) References Cited
U.S. PATENT DOCUMENTS
6,078,543 A 6/2000 Kim 6,762,963 B1 * 7/2004 Inoue et al. ................ 365/200
6,956,777 B1 * 10/2005 Komura et al. ............. 365/200
2003/0028712 A1 2/2003 Horiguchi et al.
2003/0043672 A1 3/2003 Inoue et al.

FOREIGN PATENT DOCUMENTS
JP 2003-68071 3/2003
JP 2003-323798 11/2003

* cited by examiner

*Primary Examiner*—Hoai V. Ho
(74) *Attorney, Agent, or Firm*—Arent Fox PLLC

(57) ABSTRACT

An arbiter judges which of an internal access request and an external access request takes higher priority, when the internal access request conflicts with the external access request. A redundancy judgement circuit judges which of a normal memory cell and a redundancy memory cell is accessed, in accordance with each of the internal access request and the external access request. When the arbiter gives higher priority to the internal access request, the redundancy judgement circuit carries out redundancy judgement for the external access request during internal access operation. To prevent the malfunction of a memory core, a hold circuit holds redundancy judged result, and prevents the redundancy judged result for the external access request from being transmitted to the memory core that carries out the internal access operation.

7 Claims, 10 Drawing Sheets

SEMICONDUCTOR MEMORY AUTOMATICALLY CARRYING OUT REFRESH OPERATION

CROSS-REFERENCE TO RELATED APPLICATIONS

This application is based upon and claims the benefit of priority from Japanese Patent Application No. 2004-144905, filed on May 14, 2004, the entire contents of which are incorporated herein by reference.

BACKGROUND OF THE INVENTION

1. Field of the Invention

The present invention relates to a semiconductor memory having a dynamic memory cell which needs refresh operation, and a method for operating the semiconductor memory.

2. Description of the Related Art

In recent years, a semiconductor memory called a pseudo-SRAM has received attention. The pseudo-SRAM, which has memory cells (dynamic memory cells) of a DRAM, operates as an SRAM by automatically carrying out refresh operation of the memory cells inside thereof. The dynamic memory cell is small in size, so that it is possible to develop the pseudo-SRAM with low cost per bit and high capacity.

The pseudo-SRAM generates an internal refresh request for carrying out the refresh operation irrespective of (asynchronously with) an external access request (a read request or a write request). Thus, there are cases where the refresh operation conflicts with access operation (read operation or write operation). Since the pseudo-SRAM has an SRAM interface, it is necessary to hide the refresh operation from an external system even when a conflict occurs. Accordingly, in this type of pseudo-SRAM, an external access cycle (product specification) is set longer than the sum total of actual time of the single access operation (internal access operation time) carried out inside the pseudo-SRAM in response to the external access request, and actual time of the single refresh operation (refresh operation time) carried out inside the pseudo-SRAM. The external access cycle refers to a minimum supply interval of the external access request. In the read operation, read access time, which refers to time from receiving the read request until outputting read data, becomes longest, when the read request conflicts with the internal refresh request and the read operation is carried out after the refresh operation.

A semiconductor memory such as the pseudo-SRAM has redundancy circuits in order to relieve a defect, which is caused by crystal defect in a substrate, particles during a fabrication process, and the like, and to improve a yield. To be more specific, in a test process, for example, a redundancy word line is used instead of a defected word line to relieve the defect. In the pseudo-SRAM having the redundancy circuits, the presence or absence of the use of the redundancy circuits has to be judged on an access operation basis and a refresh operation basis. Thus, time for a redundancy judgement causes increase in the access time. Especially, when the read request conflicts with the internal refresh request and the read operation is carried out after the refresh operation, it is necessary to carry out the redundancy judgement twice from receiving the read request until outputting the read data. Therefore, there is much effect on the access time.

The semiconductor memory such as the pseudo-SRAM has a refresh counter which successively generates refresh addresses indicating the memory cells to be refreshed. A technology for carrying out the redundancy judgement of the next refresh address in advance, by using the fact that the refresh addresses are successively generated, is disclosed. (For example, Japanese Unexamined Patent Application Publication Nos. 2003-323798 and 2003-68071)

In the read operation, a read address is supplied to the pseudo-SRAM with the read request. Thus, it is impossible to carry out the redundancy judgement of the read address in advance before receiving the read request, in contrast to that of the refresh address. Therefore, the redundancy judgement of the read address is conventionally carried out after the refresh operation, when the read request conflicts with the internal refresh request and the read operation is performed after the refresh operation.

SUMMARY OF THE INVENTION

An object of the present invention is to shorten access time of a semiconductor memory which automatically carries out refresh operation inside thereof. In particular, an object of the present invention is to shorten access time responding to an external access request, when an internal refresh request conflicts with the external access request and refresh operation is first carried out.

According to one aspect of the semiconductor memory according to the present invention, a memory core has a plurality of normal memory cells and at least one redundancy memory cell relieving a defected normal memory cell. An internal request generator periodically generates an internal access request. A command input circuit receives an external access request supplied through an external terminal. An arbiter judges which of the internal access request and the external access request takes higher priority, when the internal access request conflicts with the external access request. A core control circuit makes the memory core carry out internal access operation and external access operation in response to each of the internal access request and the external access request.

A redundancy judgement circuit judges which of the normal memory cell and the redundancy memory cell is accessed in response to each of the internal access request and the external access request (redundancy judgement). When the arbiter judges priority, the redundancy judgement circuit carries out the redundancy judgement corresponding to each of the internal access request and the external access request in order of the priority. When the arbiter gives higher priority to the internal access request than the external access request, the redundancy judgement circuit carries out the redundancy judgement corresponding to the external access request during the internal access operation in response to the internal access request. Therefore, it becomes unnecessary to carry out the redundancy judgement during the external access operation responding to the external access request, and hence it is possible to shorten external access operation time. As a result, it is possible to shorten access time from the reception of the external access request until the readout of data held in the memory cell. In particular, the access time becomes the worst when the internal access operation is inserted between the external access request and the external access operation. Since the worst access time is shortened, it is possible to improve the electric characteristics of the semiconductor memory.

A hold circuit holds judged result by the redundancy judgement circuit in synchronization with the start of each of the internal access operation and the external access operation, and outputs the judged result to the memory core. Thus, in the case where the redundancy judgement is carried out during the internal access operation, it is possible to prevent the judged result from being transmitted to the memory core, which carries out the internal access operation. In other words, the malfunction of the memory core is prevented.

In a preferred example in the one aspect of the semiconductor memory according to the present invention, an internal address generator generates an internal address indicating the normal memory cell accessed in accordance with the internal access request. An address input circuit receives an external address indicating the normal memory cell accessed in accordance with the external access request, through an external terminal. An address switching circuit selects the internal address until the internal access operation is started, and selects the external address and outputs the selected external address in response to the start of the internal access operation, when the arbiter gives higher priority to the internal access request than the external access request. According to this structure, the redundancy judgement circuit can start the redundancy judgement by use of the external address output from the address switching circuit during the internal access operation.

In a preferred example in the one aspect of the semiconductor memory according to the present invention, a predecoder predecodes an address output from the address switching circuit. The redundancy judgement circuit carries out the redundancy judgement in response to an address output from the predecoder.

In a preferred example in the one aspect of the semiconductor memory according to the present invention, the redundancy judgement circuit has a programming circuit programming an address indicating the defected normal memory cell. The programming circuit outputs a hit signal when the programmed address coincides with the address output from the address switching circuit. The hold circuit holds the hit signal in synchronization with the start of each of the internal access operation and the external access operation, and outputs the held hit- signal to the memory core. Thus, if the redundancy judgement circuit carries out the redundancy judgement for the external address during the internal access operation and the hit signal is output, the hit signal is held by the hold circuit until the external access operation is started. Therefore, the memory core can forbid access to the normal memory cell and access to the redundancy memory cell, in response to the hit signal output from the hold circuit without malfunction.

In a preferred example in the embodiment of the semiconductor memory according to the present invention, the redundancy judgement circuit has a plurality of programming circuits programming addresses indicating defected normal memory cells. The programming circuits are formed corresponding to the redundancy memory cells, respectively. When the programmed address coincides with the address output from the address switching circuit, each of the programming circuits outputs a hit signal and a predecoding signal indicating a corresponding redundancy memory cell. The hold circuit holds the hit signal and the predecoding signal in synchronization with the start of each of the internal access operation and the external access operation, and outputs the held hit signal and predecoding signal to the memory core. Thus, if the redundancy judgement circuit carries out the redundancy judgement for the external address during the internal access operation, and the hit signal and the predecoding signal are output, the hit signal and the predecoding signal are held by the hold circuit until the external access operation is started. Therefore, the memory core can forbid access to the normal memory cell in response to the hit signal output from the hold circuit, and access to the redundancy memory cell corresponding to the predecoding signal, without malfunction.

In a preferred example in the one aspect of the semiconductor memory according to the present invention, the memory core has a plurality of memory blocks each of which includes the normal memory cells and the redundancy memory cell. A decode circuit in the memory core selects one of the memory blocks including the redundancy memory cell corresponding to the predecoding signal, in response to the hit signal and the predecoding signal supplied through the hold circuit. Selecting the memory block after the redundancy judgement makes it possible to easily separate redundancy judgement operation from the external access operation. As a result, it is possible to easily carry out the redundancy judgement for the external address during the internal access operation.

In a preferred example in the one aspect of the semiconductor memory according to the present invention, the sum total of time necessary for the internal access operation and time necessary for the external access operation is equal to or shorter than external cycle time which is a minimum supply interval of the external access request. Therefore, a user of the semiconductor memory can design a system without being aware of the internal access operation, and hence it is possible to improve design efficiency.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Figure 1:
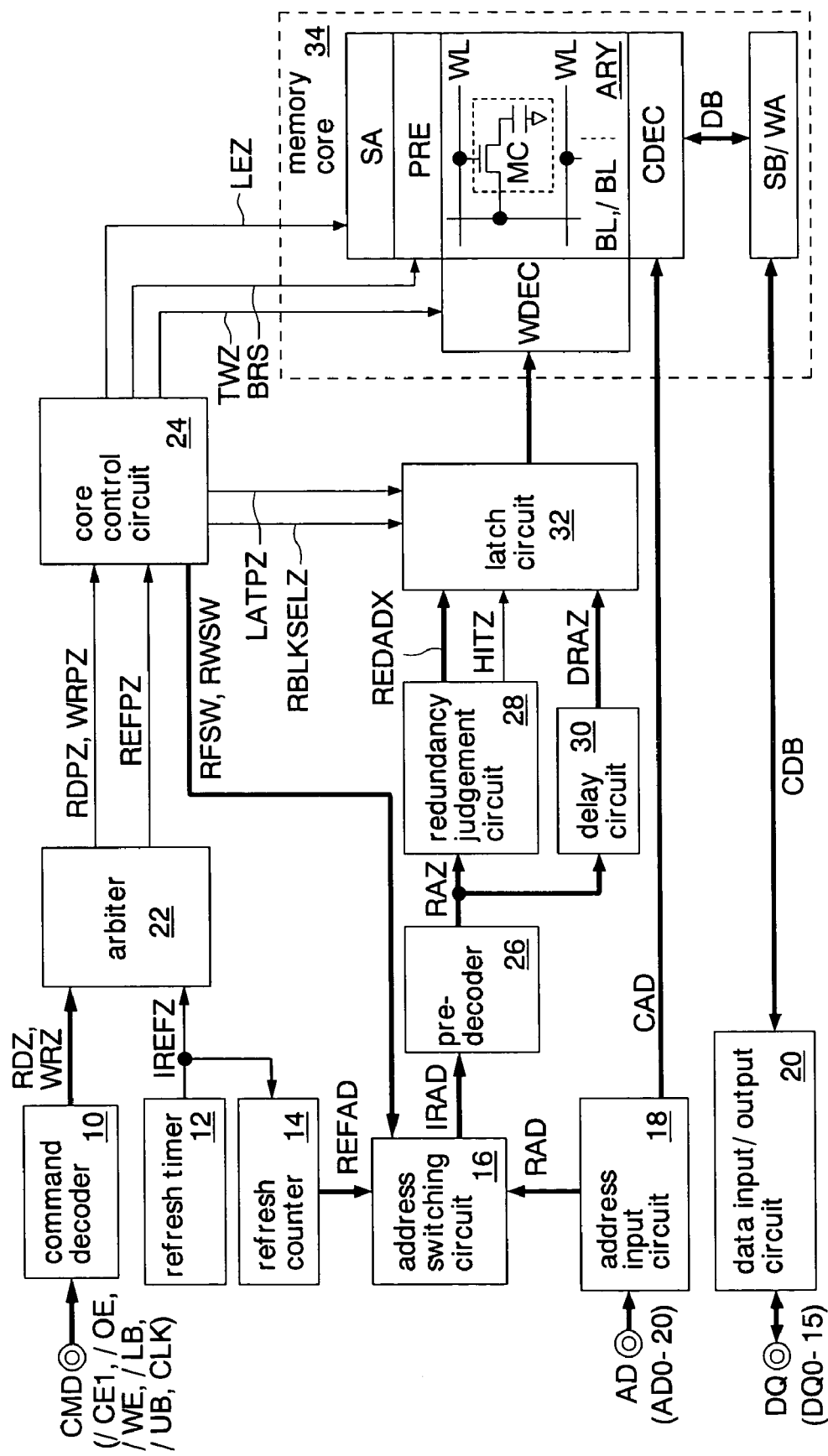
FIG. 1 is a block diagram showing an embodiment of a semiconductor memory according to the present invention.

An embodiment of the present invention will be hereinafter described by use of drawings. In the drawings, signal lines illustrated by bold lines are composed of a plurality of bits. Double circles represent external terminals (correspond to pads on a chip). Signals ending in "Z" indicate positive logic. Signals starting from "/" and signals ending in "X" indicate negative logic.

FIG. 1 shows an embodiment of a semiconductor memory according to the present invention. This semiconductor memory forms a pseudo-SRAM chip that has DRAM memory cells (dynamic memory cells) and an interface of an SRAM. The pseudo-SRAM periodically carries out refresh operation inside the chip without receiving a refresh command from outside, to hold data written on the memory cells. This pseudo-SRAM is used as, for example, a work memory mounted on a cellular phone.

The pseudo-SRAM comprises a command decoder 10 (command input circuit), a refresh timer 12 (internal request generator), a refresh counter 14 (internal address generator), an address switching circuit 16, an address input circuit 18, a data input/output circuit 20, an arbiter 22, a core control circuit 24, a predecoder 26, a redundancy judgement circuit 28, a delay circuit 30, a latch circuit 32 (hold circuit), and a memory core 34.

The command decoder receives command signals CMD (a chip enable signal/CE1, an output enable signal/OE, a write enable signal/WE. a lower byte control signal/LB, an upper byte control signal/UB, and a clock signal CLK) from outside through command terminals CMD (external terminals). The command decoder 12 decodes the command signal CMD, and outputs a read control signal RDZ for carrying out read operation or a write control signal WRZ for carrying out write operation. The pseudo-SRAM is a clock-synchronous memory that operates in synchronization with the clock signal CLK.

The refresh timer 12 outputs an internal refresh request signal IREFZ (internal access request) at regular intervals. The refresh timer 12 comprises, for example, a ring oscillator for generating an oscillation signal, and a frequency divider for generating the internal refresh request signal IREFZ from the output of the ring oscillator. The refresh counter 14 carries out count operation in response to the internal refresh request signal IREFZ, to successively generate refresh address signals REFAD.

The address switching circuit 16 outputs the refresh address signals REFAD output from the refresh counter 14 as internal row address signals IRAD, while a refresh switch signal RFSW is activated. The address switching circuit 16 outputs row address signals RAD as the internal row address signals IRAD, while a read/write switch signal RWSW is activated.

The address input circuit 18 receives address signals AD through address terminals AD (AD0–20; external terminals) to output the received signals as the row address signals RAD (high order address) and column address signals CAD (low order address). The pseudo-SRAM is an address non-multiplex type of memory that simultaneously receives the high order address and the low order address.

The data input/output circuit 20 receives read data from memory cells MC through a common data bus CDB during the read operation, and outputs the received data to data terminals DQ (DQ0–15). The data input/output circuit 20 receives write data through the data terminals DQ (DQ0–15) during the write operation, and outputs the received data to the common data bus CDB. The data terminals DQ0–7 are effective, only when the lower byte control signal /LB is activated to a low level. The data terminals DQ8–15 are effective, only when the upper byte control signal /UB is activated to the low level.

The arbiter 22 determines which of the access operation (external access operation) and the refresh operation (internal access operation) takes higher priority, by comparing the transition edge of a control signal RDZ or WRZ (read request or write request=external access request) with that of the internal refresh request signal IREFZ (refresh request=internal access request). When the access operation has higher priority, the arbiter 22 temporarily holds a refresh request, and outputs a read timing signal RDPZ or a write timing signal WRPZ in response to the external access request. After that, the arbiter 22 outputs a refresh timing signal REFPZ in response to the held refresh request, in response to the completion of the access operation of the memory core 34 corresponding to the timing signal RDPZ or WRPZ.

When the refresh operation has higher priority, on the other hand, the arbiter 22 temporarily holds the external access request, and outputs the refresh timing signal REFPZ in response to the refresh request. After that, the arbiter 22 outputs the read timing signal RDPZ or the write timing signal WRPZ in response to the held external access request, after the memory core 34 has completed the refresh operation corresponding to the refresh request.

Upon receiving the read timing signal RDPZ, the write timing signal WRPZ, or the refresh timing signal REFPZ, the core control circuit 24 outputs a word line control signal TWZ for serving as a timing signal for operating the memory core 34, a sense amplifier activation signal LEZ, and a bit line reset signal BRS. The core control circuit 24 also outputs a refresh switch signal RFSW, a read/write switch signal RWSW, a row block selection signal RBLK-SELZ, and a latch pulse signal LATPZ, in accordance with the operational status of the memory core 34.

The predecoder 29 predecodes the internal row address signals IRAD, and outputs it as predecode address signals RAZ. Since the predecoder 26 is disposed in front of the redundancy judgement circuit 28, the redundancy judgement circuit 28 can carry out redundancy judgement by using the predecode address signals RAZ. The bit number of an address used in the redundancy judgement is reduced, so that the circuit size of the redundancy judgement circuit 28 is reduced, and redundancy judgement time is shortened. The redundancy judgement circuit 28 judges which of the memory cell MC and a redundancy memory cell RMC is accessed (redundancy judgement), in response to each of the refresh request, the read request, and the write request. To be more specific, when the predecode address signals RAZ indicate a defected memory cell MC or a defected word line WL, the redundancy judgement circuit 28 outputs a redundancy address signal REDADX which corresponds to a redundancy word line RWL (refer to FIG. 5 described later) selected instead of the defected word line WL, and a hit signal HITZ. When the refresh request conflicts with the access request, the redundancy judgements are carried out in order of judgement by the arbiter 22.

The delay circuit 30 has the same delay time as the operation time of the redundancy judgement circuit 28. The delay circuit 30 delays the predecode address signals RAZ, and outputs them as delayed predecode address signals DRAZ. The latch circuit 32 latches each of the hit signal HITZ, the redundancy address signal REDADX, and the delayed predecode address signals DRAZ in synchronization with the latch pulse signal LATPZ. Then, the latch circuit 32 outputs the latched signals in synchronization with the row block selection signal RBLKSELZ.

The memory core 34 comprises a memory array ARY, a word decoder part WDEC, a sense amplifier section SA, a precharge section PRE, a column decoder section CDEC, a sense buffer part SB, and a write amplifier part-WA. The memory array ARY has a plurality of volatile normal memory cells MC (dynamic memory cells), and a plurality of word lines WL and a plurality of bit lines BL and /BL (complementary bit lines) connected to the memory cells MC. The memory array ARY has a plurality of volatile redundancy memory cells RMC (dynamic memory cells), and a plurality of redundancy word lines RWL connected to the redundancy memory cells RMC, though they are not shown. The normal memory cells MC and the redundancy memory cells RMC are connected to the common bit lines BL and /BL. Each of the memory cells MC and RMC is the same as the general DRAM memory cell, and has a capacitor for holding data as electric charge, and a transfer transistor disposed between the capacitor and the bit line BL (or /BL). The gate of the transfer transistor is connected to the word line WL (or RWL). By selecting the word lines WL or RWL, one of the read operation, the write operation, and the refresh operation is carried out. After one of the read operation, the write operation, and the refresh operation is carried out, the memory array ARY carries out precharge operation for precharging the bit lines BL and /BL with a predetermined voltage, in response to a bit line reset signal BRS.

The word decoder part WDEC (decoder circuit) operates in response to the signals output from the latch circuit 32. The word decoder part WDEC selects any of the word lines WL and RWL in synchronization with the word line control signal TWZ, and changes the selected word lines WL or RWL to a high level. The column decoder section CDEC outputs column line signals in accordance with the column address signals CAD, to turn on column switches. Each of the column switches connects each bit line BL or /BL to a data bus DB.

The sense amplifier section SA has a plurality of sense amplifiers. Each sense amplifier operates in response to the sense amplifier activation signal LEZ to amplify the amount of a signal of data on the bit line BL or /BL. The data amplified by the sense amplifiers is transmitted to the data bus DB through the column switches during the read operation. The data amplified by the sense amplifiers is written into the memory cells MC (or RMC) through the bit lines during the write operation. The precharge section PRE has a plurality of precharge circuits, each of which is connected to a pair of bit lines BL and /BL. Each precharge circuit precharges the bit lines BL and /BL with the predetermined voltage in response to the bit line reset signal BRS.

The sense buffer part SB amplifies the amount of signals of read data on the data bus DB, and outputs it to the common data bus CDB. The write amplifier part WA amplifies the amount of signals of write data on the common data bus CDB, and outputs it to the data bus DB.

Figure 2:
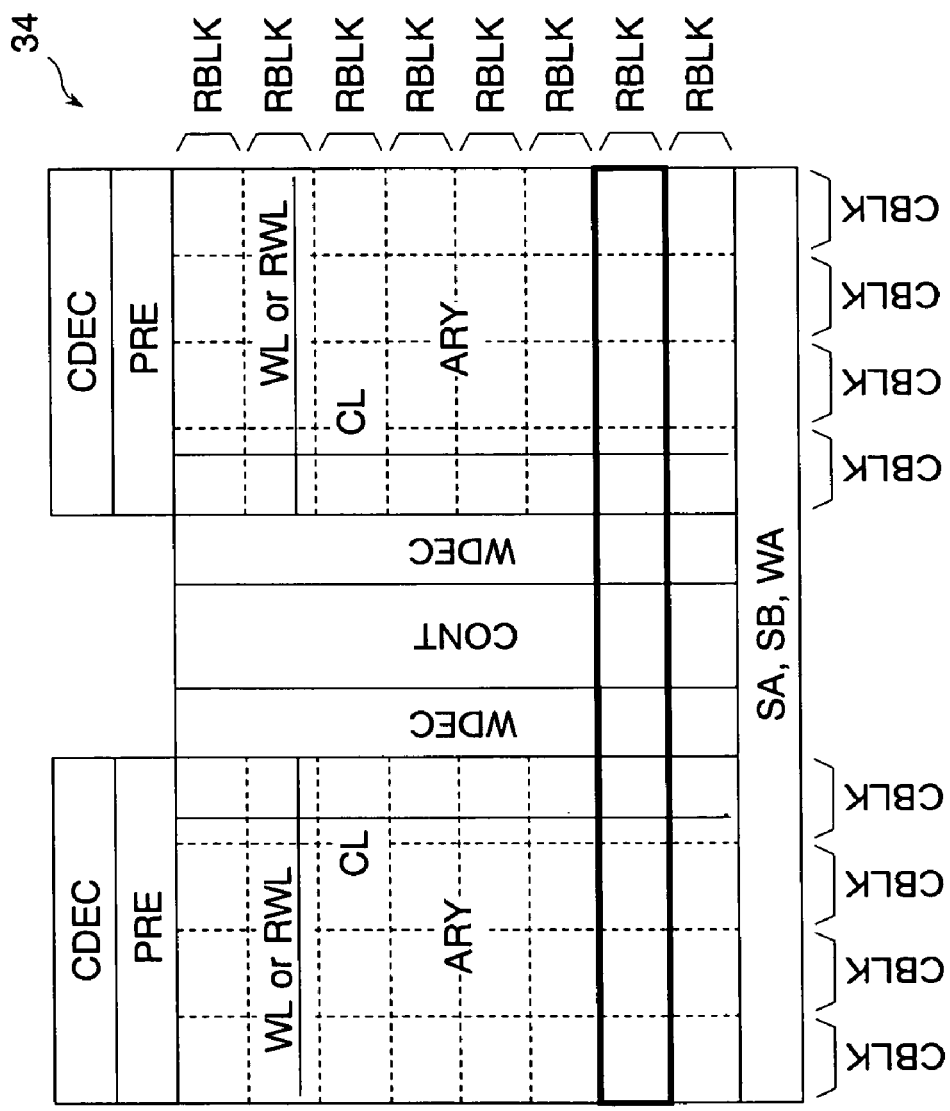
FIG. 2 is a block diagram showing the details of a memory core shown in FIG. 1.

FIG. 2 shows the details of the memory core 34 shown in FIG. 1. The memory core 34 has a pair of memory arrays ARY and they are symmetrical to each other. The memory arrays ARY are partitioned into a plurality of row blocks RBLK (memory blocks) by broken lines extending in a horizontal direction in the drawing. In the drawing, one of the row blocks RBLK is indicated by bold lines. Each row block RBLK has the plurality of word lines WL and the two redundancy word lines RWL. The word line WL is connected to the not-illustrated normal memory cells MC, and the redundancy word line RWL is connected to the not-illustrated redundancy memory cells RMC. One of the row blocks RBLK is selected in accordance with the single read operation, write operation, or refresh operation.

In this embodiment, the memory core 34 has the eight row blocks RBLK and the sixteen redundancy word lines RWL. It is possible to relieve a defect in the memory cell MC or the word line WL in a certain row block RBLK by use of not only the redundancy word line RWL of the same row block RBLK, but also the redundancy word line RWL of another row block RBLK. Therefore, even if the sixteen word lines WL in the single row block RBLK are defected, it is possible to relieve the defect.

The memory arrays ARY are partitioned into a plurality of column blocks CBLK by broken lines extending in a vertical direction in the drawing. Each column block CBLK has the plurality of bit line pairs BL and /BL (not illustrated), and a plurality of column selection signal lines CL. The column selection signal lines CL are activated by the column decoder section CDEC. In each memory array ARY, any of the column selection signal lines CL are selected (one column selection signal line CL per DQ) in accordance with the single read operation, write operation, or refresh operation. In other words, the two column blocks CBLK operate at the same time.

The column decoder section CDEC and the precharge section PRE are disposed at one end of the memory array ARY (at one end of the column blocks CBLK). The sense amplifier section SA, the sense buffer part SB, and the write amplifier part WA are disposed at the other end of the memory array ARY (at the other end of the column blocks CBLK). The word decoder parts WDEC, each of which corresponds to each memory array ARY, are disposed between the memory arrays ARY. A control circuit part CONT is disposed between the word decoder parts WDEC.

Figure 3:
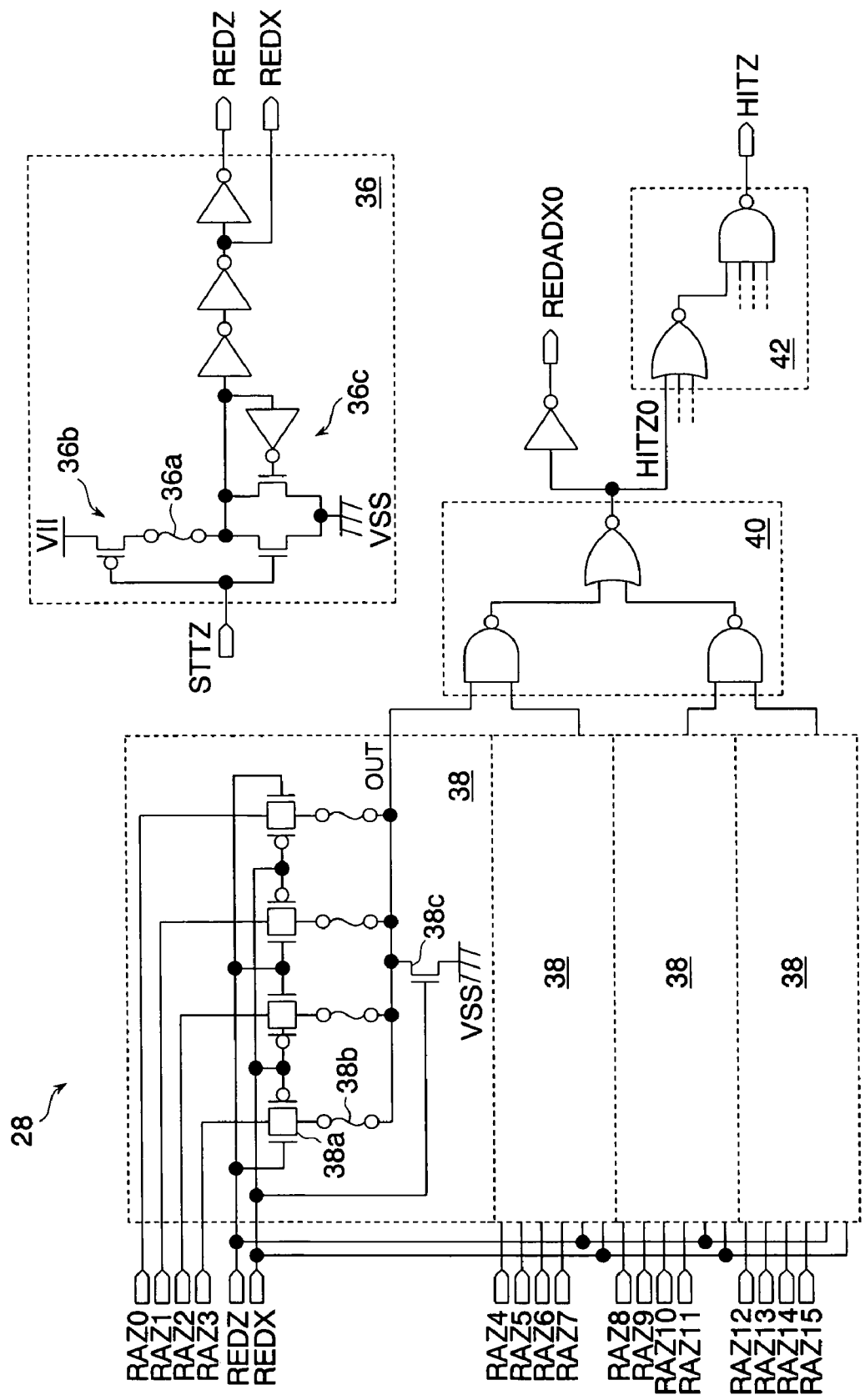
FIG. 3 is a circuit diagram showing the details of a redundancy judgement circuit shown in FIG. 1.

FIG. 3 shows the details of the redundancy judgement circuit 28 shown in FIG. 1. A circuit shown in the drawing is formed per redundancy word line RWL. In other words, the redundancy judgement circuit 28 has the sixteen circuits shown in the drawing. The redundancy judgement circuit 28 has redundancy judgement circuits 36, address write circuits 38 in groups of four (programming circuits), AND circuits 40, and an OR circuit 42. The redundancy judgement circuit 36 judges the use or disuse of the corresponding redundancy word line RWL. The address of the word line WL to be relieved is written into the four address write circuits 38.

The redundancy judgement circuit 36 has a CMOS inverter 36*b* and a feedback circuit 36*c* (an inverter+an n MOS transistor). In the CMOS inverter 36*b*, a judge fuse 36*a* is disposed between a p MOS transistor and an n MOS transistor. The feedback circuit 36*c* latches the output level of the CMOS inverter 36*b*. The input of the CMOS inverter 36*b* receives a starter signal STTZ which is temporarily changed into a high level to initialize the latch circuit when the pseudo-SRAM is turned on. The redundancy judgement circuit 36 is initialized in response to the starter signal STTZ in accordance with the program status of the judge fuse 36*a*. An internal power supply voltage VII is applied to the CMOS inverter 36*b*. The internal power supply voltage VII is a voltage to which an external power supply voltage supplied through a power terminal is transformed low. When the judge fuse 36*a* is cut (programmed), the redundancy judgement circuit 36 outputs a high level redundancy signal REDZ and a low level redundancy signal REDX. When the judge fuse 36*a* is not cut, the redundancy judgement circuit 36 outputs a low level redundancy signal REDZ and a high level redundancy signal REDX.

Each address write circuit 38 has four CMOS transmission gates 38*a*, four fuses 38*b* connected to the output of the CMOS transmission gates 38*a*, and an n MOS transistor 38*c*. The four CMOS transmission gates 38*a* are turned on upon receiving the high level redundancy signal REDZ and the low level redundancy signal REDX, to transmit the four predecode address signals RAZ (RAZ0–3, RAZ4–7, RAZ8–11, and RAZ12–15) to the fuses 38*b*, respectively. Each of the four fuses 38*b* is disposed between the output of the CMOS transmission gate 38*a* and an output terminal OUT. The gate of the n MOS transistor 38c, which is disposed between the output terminal OUT and a ground wire VSS, receives the redundancy signal REDX.

When the corresponding redundancy word line RWL is used, in other words, when the fuse 36a of the redundancy judgement circuit 36 is cut, the predecode address signals RAZ which indicate the word line WL to be relieved are programmed to each address write circuit 38. To be more specific, in each address write circuit 38, three of the four fuses 38b are cut to transmit only one of the four predecode address signals RAZ to the output terminal OUT.

The AND circuit 40 outputs a high level hit signal HITZ0, when all of the predecode address signals RAZ output from the address write circuits 38 are at a high level. A plurality of AND circuits 40 corresponding to the other address write circuits 38, which are not illustrated, output hit signals HITZ1–15, respectively. The reverse logic of the hit signal HITZ0 is output as a redundancy address signal REDADX0 (or REDADX1–15). The OR circuit 42 outputs a high level hit signal HITZ, when any of the hit signals HITZ0–15 is at a high level.

In the above-described redundancy judgement circuit 28, the fuses 36a and 38b are programmed during a test process of the pseudo-SRAM in accordance with the address indicating the word line WL to be relieved. The programmed redundancy judgement circuit 28 activates the hit signal HITZ and the redundancy address signal REDADX that indicates the redundancy word line RWL used instead of the defected word line WL, upon receiving the programmed predecode address signals RAZ from the predecoder 26. The judge fuse 36a and the fuses 38b are made of polysilicon, a plug, a non-volatile memory cell, or the like.

Figure 4:
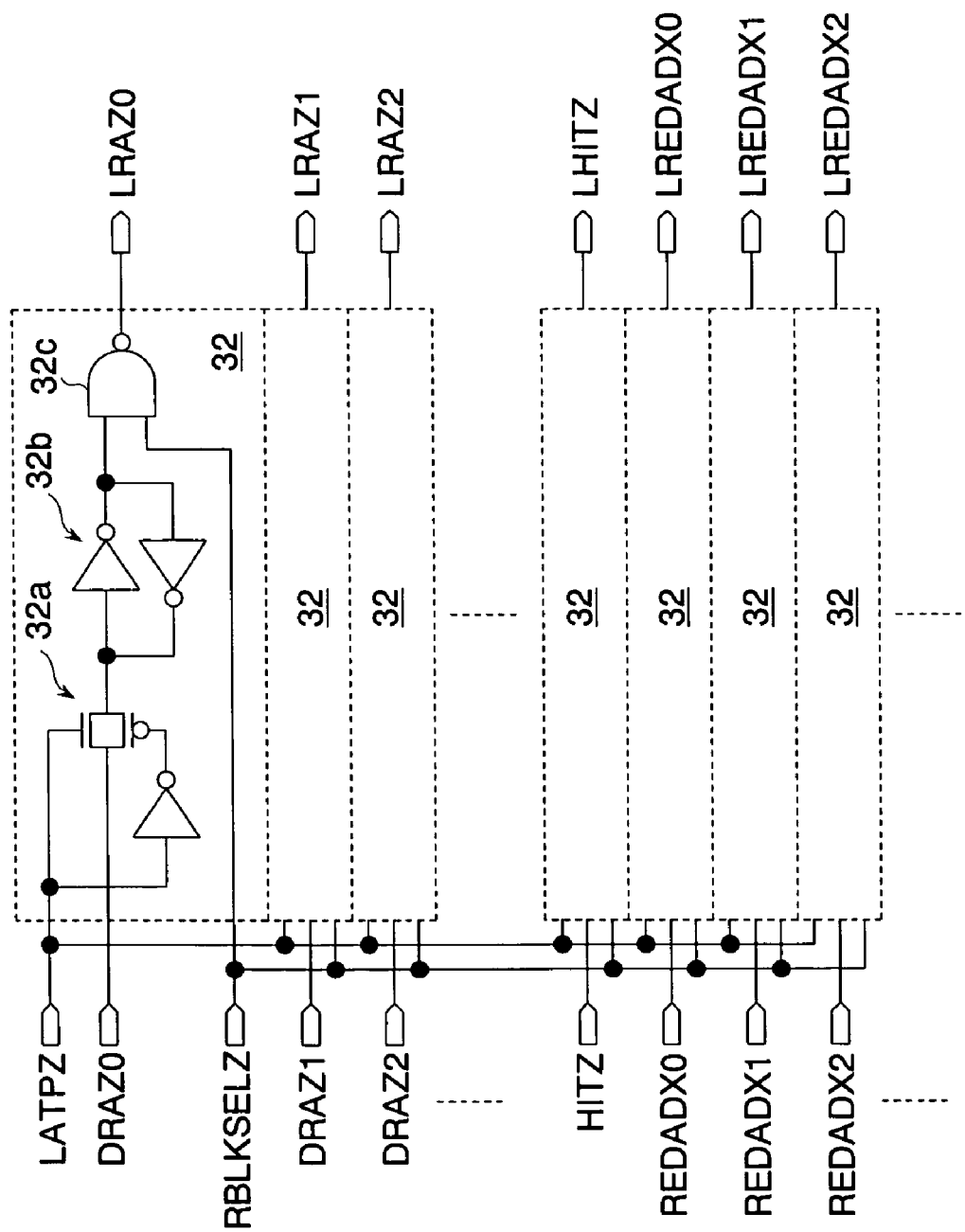
FIG. 4 is a circuit diagram showing the details of a latch circuit shown in FIG. 1.

FIG. 4 shows the details of the latch circuit 32 shown in FIG. 1. The latch circuit 32 is formed for each of the predecode address signals DRAZ0–n, the hit signal HITZ, and the redundancy address signals REDADX0–15.

Each latch circuit 32 has a CMOS transmission gate 32a, a latch section 32b, and a NAND gate 32c. The CMOS transmission gate 32a is turned on upon receiving the high level latch pulse signal LATPZ. The latch section 32b latches the logic level of a signal transmitted through the CMOS transmission gate 32a. The NAND gate 32c outputs the latched signal level as predecode address signals LRAZ0–n, a hit signal LHITZ, or redundancy address signals LREDADX0–15, when the row block selection signal RBLKSELZ is at a high level.

Figure 5:
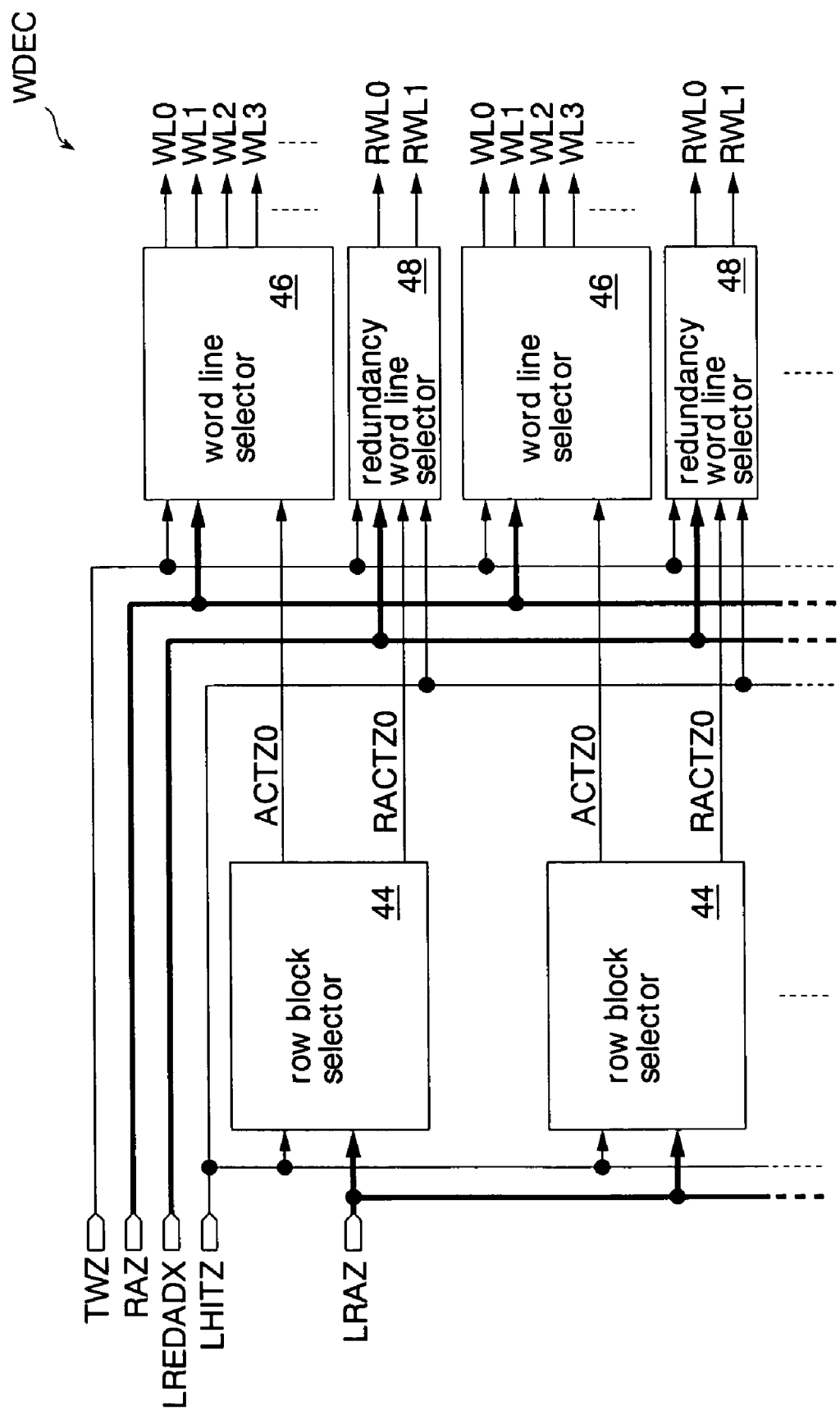
FIG. 5 is a block diagram showing the details of a word decoder part shown in FIG. 1.

FIG. 5 shows the details of the word decoder part WDEC shown in FIG. 1. The word decoder part WDEC has row block selectors 44, word line selectors 46, and redundancy word line selectors 48. The row block selector 44, word line selector 46, and redundancy word line selector 48 correspond to each of the eight row blocks RBLK shown in FIG. 2.

In the read operation, write operation, or refresh operation, each row block selector 44 outputs a high level activation signal ACTZ (ACTZ0–n) and a low level redundancy activation signal RACTZ (RACTZ0–8) to select one of the word lines WL, when the internal row address signals IRAD do not indicate the address programmed by the redundancy judgement circuit 28 (hit signal LHITZ=low level) and the high order bits of the predecode address signals LRAZ (LRAZ0–n) indicate the corresponding row block RBLK.

In the read operation, write operation, or refresh operation, each row block selection circuit 44 outputs the low level activation signal ACTZ (ACTZ0–n) and the high level redundancy activation signal RACTZ (RACTZ0–8) to select one of the redundancy word lines RWL, when the internal row address signals IRAD indicate the address programmed by the redundancy judgement circuit 28 (hit signal LHITZ=high level). In other words, when the internal row address signals IRAD (FIG. 1) indicate the defected word line WL, the defected word line WL corresponding to the internal row address signals IRAD is selected. It is forbidden to activate the activation signal ACTZ, in order to prevent the normal memory cell MC from being accessed. The redundancy activation signal RACTZ is activated to select one of the redundancy word lines RWL and access to the redundancy memory cell.

Each word line selection circuit 46 selects one of the word lines WL in accordance with the low order bits of the predecode address signals RAZ, upon receiving the high level activation signal ACTZ. The selected word line WL is changed to a high level, while the word line control signal TWZ is at a high level. Each redundancy word line selection circuit 48 selects one of the redundancy word lines RWL corresponding to the redundancy address signals LREDADX, when the redundancy activation signal RACTZ is activated (at a high level) and the corresponding redundancy address signal LREDADX is activated (at a low level). The selected redundancy word line RWL is changed to a high level, while the word line control signal TWZ is at the high level.

Figure 6:
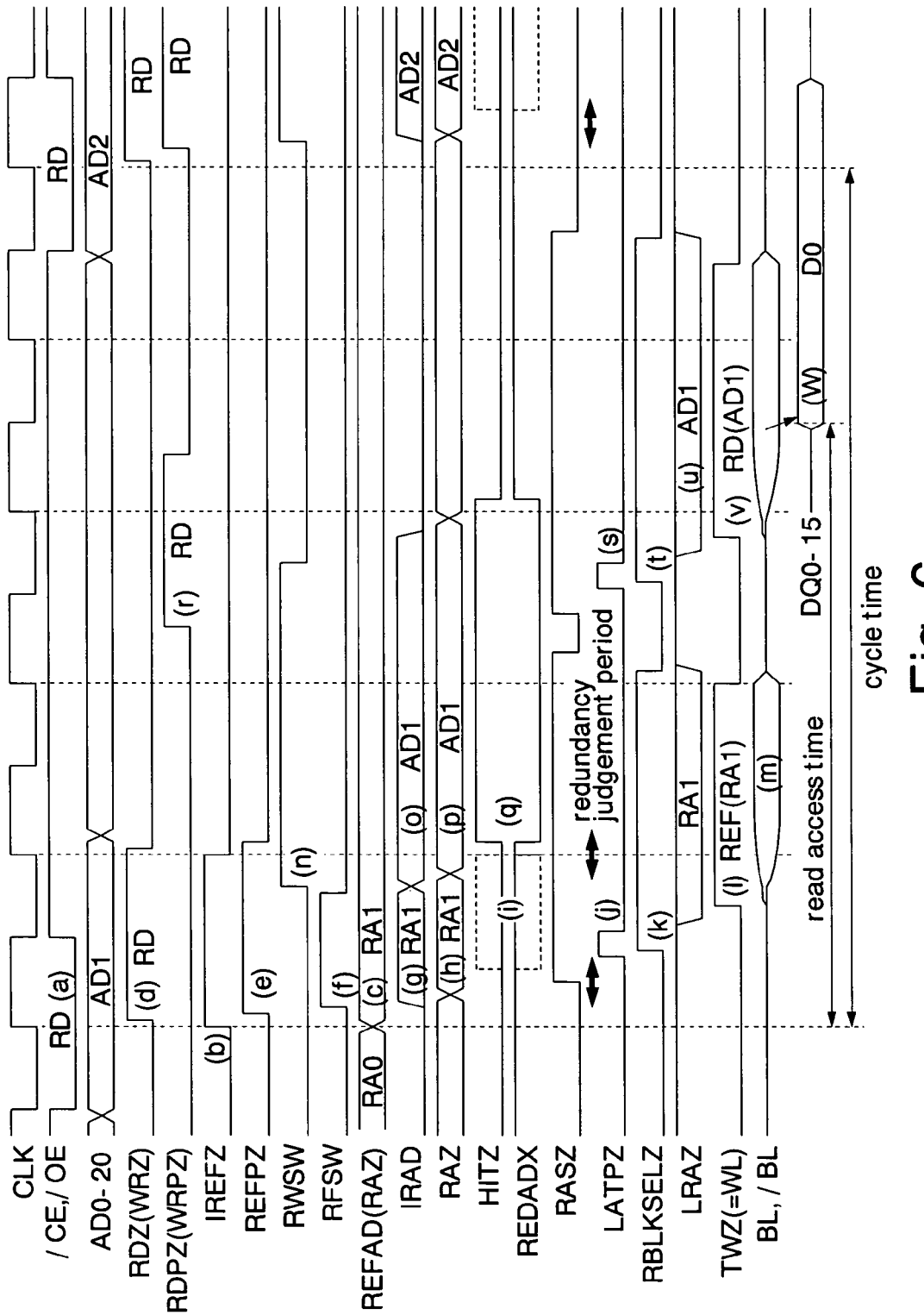
FIG. 6 is a timing chart showing an example of read operation of a pseudo-SRAM according to the present invention.

FIG. 6 shows an example of the read operation by the above-described pseudo-SRAM. The pseudo-SRAM receives the command signal CMD in synchronization with the rising edges of the clock signal CLK. The cycle time of the minimum supply interval (product specification) of the command signal CMD (read command or write command) is set at five clock periods.

In this example, the read operation is carried out by receiving the low level chip enable signal /CE and output enable signal /OE (read command RD), and the address signals AD0–20 in synchronization with the rising edge of the clock signal CLK (FIG. 6(a)). The refresh timer 12 outputs the internal refresh request signal IREFZ at the same timing as the reception of the read command RD (FIG. 6(b)). The refresh counter 14 counts up in synchronization with the internal refresh request signal IREFZ, and changes the refresh address signals REFAD from RA0 to RA1 (FIG. 6(c)).

The command decoder 10 activates the read control signal RDZ in response to the reception of the read command RD (FIG. 6(d)). The arbiter 22 determines to carry out the refresh operation prior to the read operation. The arbiter 22 temporarily holds the read command RD, and outputs the refresh timing signal REFPZ (FIG. 6(e)).

The core control circuit 24 activates the refresh switch signal RFSW to a high level in response to the refresh timing signal REFPZ (FIG. 6(f)). The address switching circuit 16 outputs the refresh address signals REFAD (RA1) as the internal row address signals IRAD (FIG. 6(g)). The predecoder 26 predecodes the internal row address signals IRAD, and outputs the predecode address signals RAZ (FIG. 6(h)).

The redundancy judgement circuit 28 judges whether or not the predecode address signals RAZ indicate the defected word line WL Namely, when the predecode address signals RAZ indicate the defected word line WL, as shown by broken lines in the drawing, the hit signal HITZ and the redundancy address signal REDADX, which indicates the redundancy word line RWL to be replaced, are activated (FIG. 6(i)). A bold arrow in the drawing indicates a redundancy judgement period by the redundancy judgement circuit 28. To carry out the latch operation of the latch circuit 32 by the single latch pulse signal LATPZ, the delay time of the delay circuit 30 is set to the same time as the redundancy judgement period.

The core control circuit 24 outputs the latch pulse signal LATPZ, after a lapse of predetermined time since the row control signal RASZ (used inside the core control circuit 24) being a basic timing signal for operating the memory core 34 is activated (FIG. 6(j)). The latch circuit 32 latches a redundancy judged result (HITZ and REDADX) and the predecode address signals DRAZ delayed by the delay circuit 30, in synchronization with non-activation of the latch pulse signal LATPZ. The latch circuit 32 outputs the latched signals as the predecode address signals LRAZ, the hit signal LHITZ, and the redundancy address signals LREDADX, in synchronization with activation of the row block selection signal RBLKSELZ to a high level (FIG. 6(k)). In other words, the latch circuit 32 holds the judged result by the redundancy judgement circuit 28 and outputs the held judgement result to the memory core 34, in synchronization with the start of the refresh operation.

The word decoder part WDEC selects any of the word lines WL and RWL in accordance with the predecode address signals LRAZ and RAZ, the hit signal LHITZ, and the redundancy address signals LREDADX. The word decoder part WDEC changes the selected word lines WL or RWL to a high level in synchronization with the word line control signal TWZ (FIG. 6(l)). Then, the refresh operation is carried out (FIG. 6(m)). In this example, there is no defect in the word lines WL connected to the memory cells MC to be refreshed, so that the hit signal HITZ and any of the redundancy address signals REDADX are not activated. Thus, one of the row block selection circuits 44 (FIG. 5) of the word decoder part WDEC outputs the activation signal ACTZ.

The core control circuit 24 inactivates the refresh switch signal RFSW to a low level, and activates the read/write switch signal RWSW to a high level, in response to activation of the word lines WL due to the refresh operation (FIG. 6(n)). The address switching circuit 16 outputs the row address signals RAD as the internal row address signals IRAD (AD1: read address), in response to activation of the read/write switch signal RWSW (FIG. 6(o)). In other words, when the arbiter 22 gives higher priority to the refresh request than the read request, the address switching circuit 16 selects the refresh address signals REFAD until the refresh operation is started. The address switching circuit 16 selects the row address signals RAD in response to the start of the refresh operation, and outputs the selected address. Therefore, the redundancy judgement circuit 28 easily starts the redundancy judgement of the row address signals RAD (external address) during the refresh operation. The predecoder 26 predecodes the internal row address signals IRAD, and outputs the predecode address signals RAZ (AD1) (FIG. 6(p)).

The redundancy judgement circuit 28 judges whether or not the predecode address signals RAZ (AD1) indicate the defected word line WL. In other words, the redundancy judgement circuit 28 carries out the redundancy judgement corresponding to the read request during the refresh operation corresponding to the refresh request, when the arbiter 22 has given higher priority to the refresh request than the read request. In this example, the predecode address signals RAZ indicate the defected word line WL, so that the hit signal HITZ and the redundancy address signal REDADX indicating the redundancy word line RWL to be replaced are activated (FIG. 6(q)). A bold arrow in the drawing indicates the redundancy judgement period by the redundancy judgement circuit 28.

The latch circuit 32 does not receive signals supplied from the redundancy judgement circuit 28 and the delay circuit 30, until the inactivated latch pulse signal LATPZ is activated again in response to the start of the read operation. Thus, if the redundancy judgement circuit 28 outputs the redundancy judged result (HITZ and REDADX) during the refresh operation, the judged result is prevented from being transmitted to the word decoder part WDEC. As a result, if the redundancy judgement of the read address AD1 is carried out during the refresh operation, the redundancy judgement has no effect on the memory core 34. In other words, it is possible to carry out the redundancy judgement of the read address AD1 before carrying out the read operation, and to hold the redundancy judged result until the start of the read operation.

As shown in the drawing, when the arbiter 22 determines to carry out the refresh operation prior to the read operation, the redundancy judgement circuit 28 carries out redundancy judgement operation during the refresh operation. Namely, the redundancy judgement of the address signals AD0–20, which are supplied from the outside of the pseudo-SRAM with the read command RD, is carried out during the refresh operation within the operation cycle (five clock periods) for carrying out the read operation. In other words, the redundancy judgement operation for the read operation is completed before starting the read operation.

After the refresh operation has been completed, the core control circuit 24 activates the read timing signal RDPZ in synchronization with the activation of the row control signal RASZ (FIG. 6(r)). The core control circuit 24 outputs the latch pulse signal LATPZ after a lapse of predetermined time since the activation of the row control signal RASZ (FIG. 6(s)). The latch circuit 32 latches the redundancy judged result (HITZ and REDADX) and the predecode address signals DRAZ delayed by the delay circuit 30, in synchronization with the inactivation of the latch pulse signal LATPZ. The latch circuit 32 outputs the latched signals as the predecode address signals LRAZ, the hit signal LHITZ, and the redundancy address signals LREDADX in synchronization with the activation of the row block selection signal RBLKSELZ to a high level (FIG. 6(t)). In other words, the latch circuit 32 holds the judged result by the redundancy judgement circuit 28 and outputs the held judged result to the memory core 34, in synchronization with the start of the read operation. As described above, the redundancy judged result of the read address which is carried out during the refresh operation is not transmitted to the word decoder part WDEC until the read operation has been started. Therefore, it is possible to prevent the multifunction of the memory core 34 during the refresh operation.

In this example, there is a defect in any of the word lines WL connected to the memory cells MC to be accessed for read, so that the redundancy judgement circuit 28 activates the hit signal HITZ and the redundancy address signal REDADX (any of REDADX0–15) (FIG. 6(u)). The word decoder part WDEC activates the redundancy activation signal RACTZ (RACTZ0–8), and selects one of the redundancy word lines RWL0–15 accordance with the hit signal HITZ and the redundancy address signal REDADX. Then, the word decoder part WDEC changes the selected redundancy word line RWL to a high level in synchronization with the word line control signal TWZ (FIG. 6(v)). Then, the read operation is carried out, and hence data D0 of 16 bits read out of the memory cells MC is output to the outside of the pseudo-SRAM through the data terminals DQ0–15 (FIG. 6(w)).

Time from the supply of the read command RD until the output of the read data D0 is defined as read access time. The read access time (practical value) becomes worst when the refresh operation is inserted before the read operation in the single cycle time. According to the present invention, however, the redundancy judgement for the read operation is carried out during the refresh operation, so that it is possible to shorten the read access time than ever before. As a result, it is also possible to shorten the cycle time, which is the minimum supply interval of the command signal CMD.

In the pseudo-SRAM according to the present invention, the sum total of the operation time of the memory core 34 necessary for the refresh operation and the operation time of the memory core 34 necessary for the read operation or write operation is set equal to or shorter than the cycle time. The cycle time is the minimum supply interval (product specification) of the command signal CMD (read command or write command). Therefore, a user of the pseudo-SRAM can design a system without being aware of the refresh operation, and hence it is possible to improve design efficiency.

Figure 7:
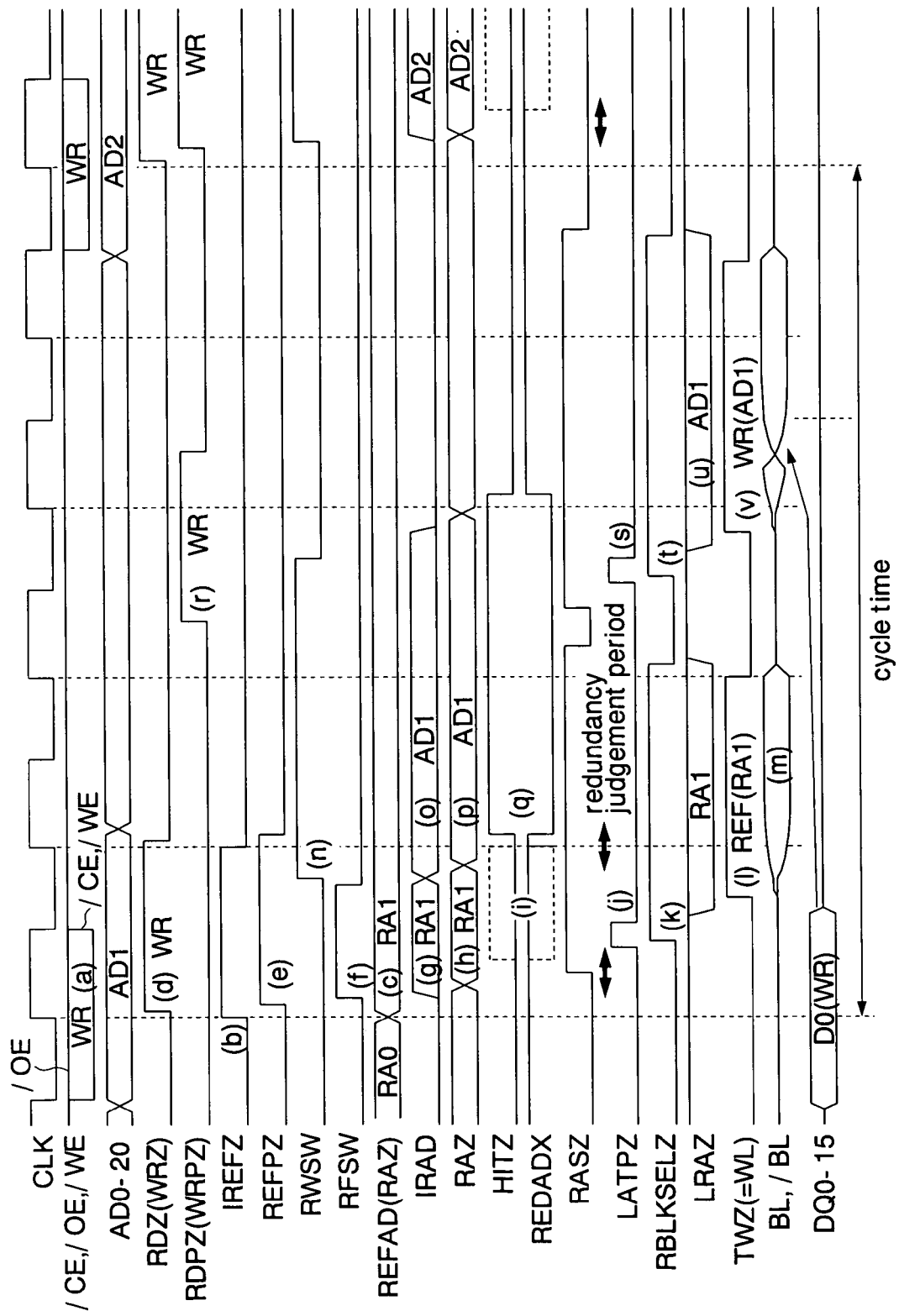
FIG. 7 is a timing chart showing an example of write operation of the pseudo-SRAM according to the present invention.

FIG. 7 shows an example of the write operation by the above-described pseudo-SRAM. The same letter symbols refer to the same operation as above-described FIG. 6, and detailed description thereof will be omitted. In this example, as in the case of FIG. 6, the refresh timer 12 outputs the internal refresh request signal IREFZ at the same timing as the reception of the write command WR. Thus, the refresh operation is carried out before the write operation in a write cycle. The redundancy judgement for the write operation is carried out during the refresh operation.

Figure 8:
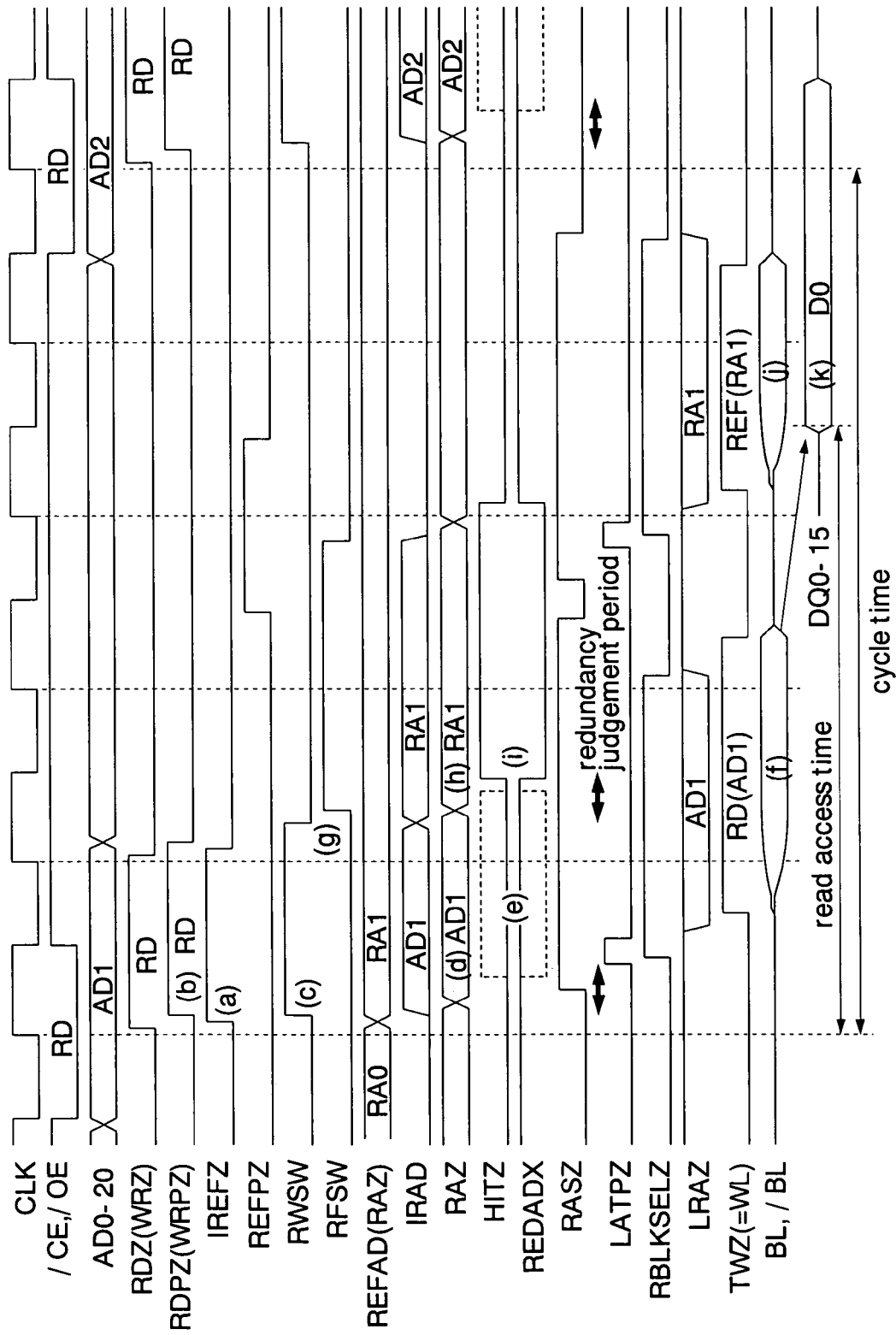
FIG. 8 is a timing chart showing another example of the read operation of the pseudo-SRAM according to the present invention.

FIG. 8 shows another example of the read operation by the above-described pseudo-SRAM. In this example, the refresh request (IREFZ) occurs just after the reception of the read command RD (FIG. 8(a)), and the refresh operation is carried out after the read operation. The detailed description of the same operation as the above-described FIG. 6 will be omitted.

The arbiter 22 outputs the read timing signal RDPZ in response to the read control signal RDZ (FIG. 8(b)). Thus, the core control circuit 24 activates the read/write switch signal RWSW (FIG. 8(c)). The predecoder 26 receives a read address AD1 as the internal row address signals IRAD, and outputs the predecode address signals RAZ (FIG. 8(d)). Then, the redundancy judgement circuit 28 carries out the redundancy judgement of the read address AD1. In this example, since the word line WL indicated by the predecode address signals RAZ (AD1) normally functions, the hit signal HITZ and the redundancy address signal REDADX are not activated (FIG. 8(e)). Then, the word line WL corresponding to the read address AD1 is activated, and the read operation is carried out (FIG. 8(f)). When the predecode address signals RAZ (AD1) indicates the defected word line WL, as shown by broken lines in the drawing, the hit signal HITZ and the redundancy address signal REDADX are activated.

The core control circuit 24 inactivates the read/write switch signal RWSW to a low level after a lapse of time since the activation of the word line WL, and activates the refresh switch signal RFSW to a high level (FIG. 8(g)). The predecoder 26 receives the refresh address signals REFAD (RA1) as the internal row address signals IRAD, and outputs the predecode address signals RAZ (FIG. 8(h)). Then, the redundancy judgement circuit 28 carries out the redundancy judgement of the refresh address signals RA1. In this example, the predecode address signals RAZ (RA1) indicate the defected word line WL, the hit signal HITZ and the redundancy address signal REDADX are activated (FIG. 8(i)). After the completion of the read operation, one of the redundancy word lines RWL0–15 activated, and the refresh operation is carried out (FIG. 8(j)).

Data D0 read out of the memory cells MC in the read operation is, for example, temporarily held in the data input/output circuit 20, and is output to the data terminals DQ0–15 predetermined timing (FIG. 8(k)). When the access request (read command RD) conflicts with the refresh request (internal refresh request signal IREFZ) and the read operation is first carried out, there is sufficient time from the readout of data to the bit lines BL and /BL until the output thereof to the data terminals DQ0–15. Therefore, the redundancy judgement period does not affect the read access time.

Figure 9:
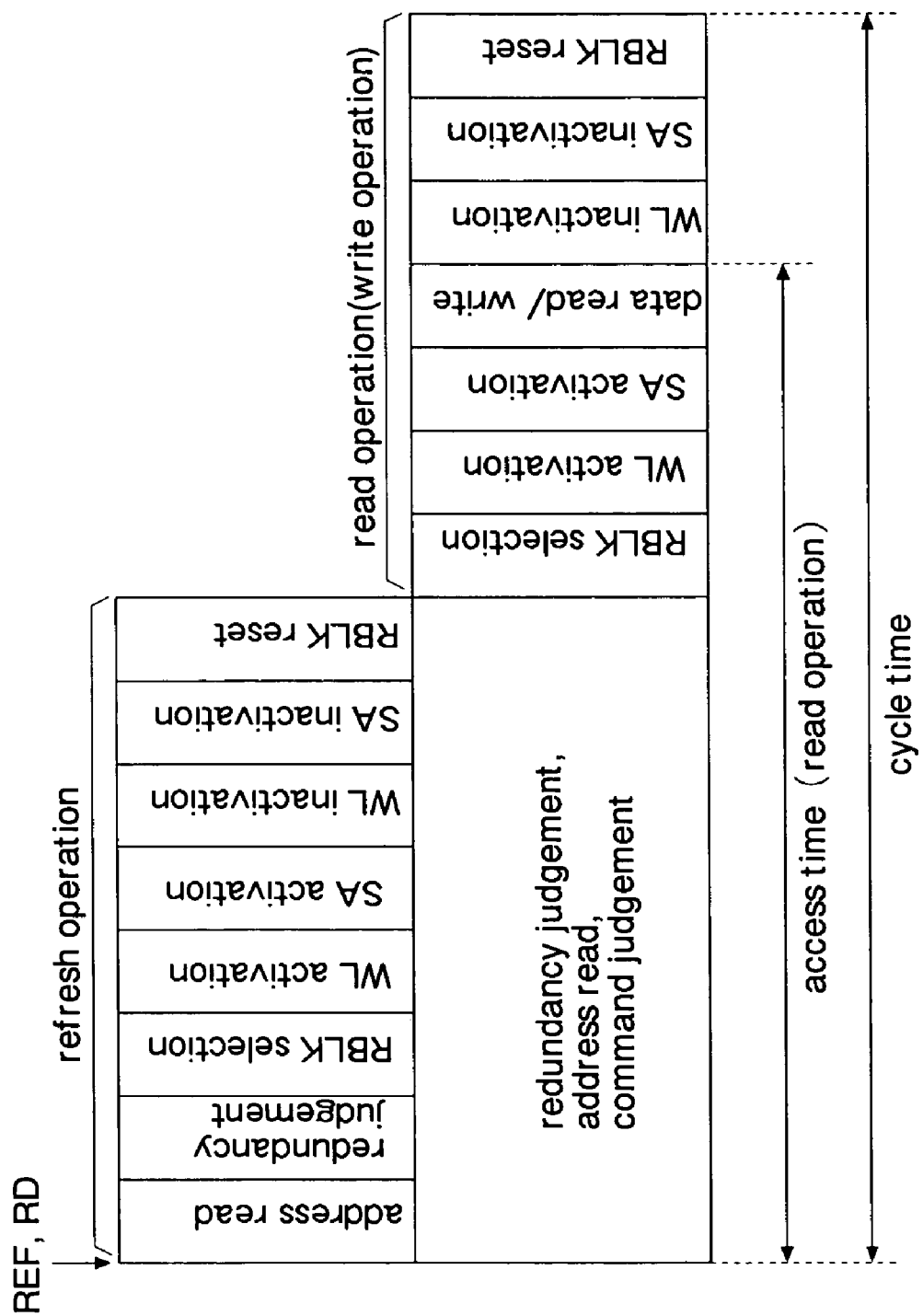
FIG. 9 is an explanatory view of the general outlines of the read operation shown in FIG. 6.

FIG. 9 shows the general outlines of the read operation shown in FIG. 6. According to the present invention, when the access request RD conflicts with the refresh request REF and the read operation is carried out after the refresh operation, the redundancy judgement of the read address is carried out during the refresh operation, together with the read of the read address and the judgement of the read command. Therefore, it is possible to eliminate time for the redundancy judgement from the execution time of the read operation. As a result, the access time from the supply of the read command until the output of the read data is shortened by time for the redundancy judgement of the read address. The cycle time being the minimum supply interval of the access command (read command or write command) is also shortened.

Figure 10:
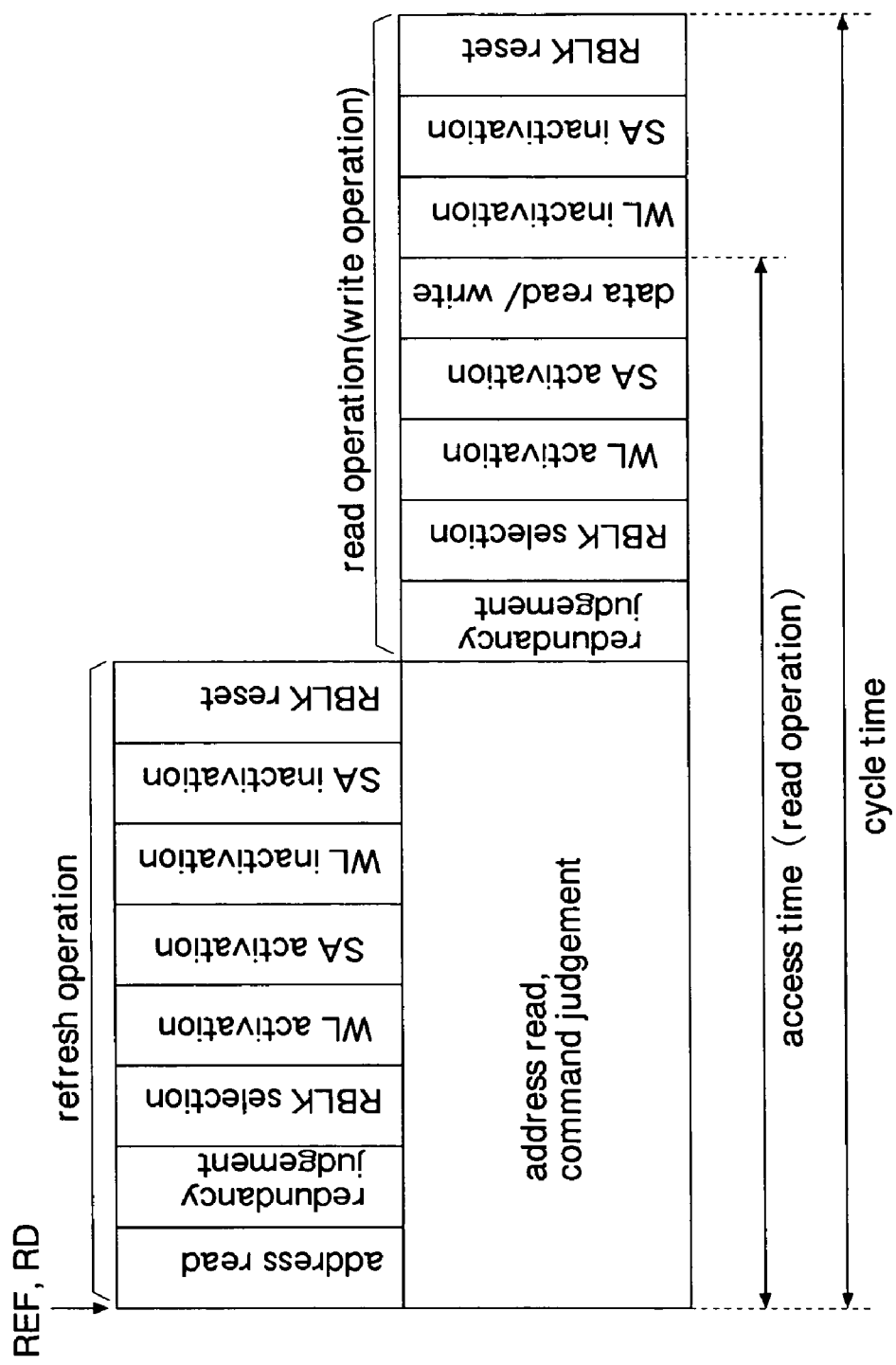
FIG. 10 is an explanatory view of the general outlines of read operation before the present invention.

FIG. 10 shows the general outlines of read operation before the present invention. Before the present invention, the redundancy judgement of the read address was always carried out during the read operation. Thus, the access time and the cycle time in the read operation were longer than those of the present invention shown in FIG. 9.

In this embodiment, as described above, when the access request conflicts with the refresh request and the refresh operation is first carried out, the redundancy judgement for the access request is carried out during the refresh operation. Thus, it is possible to shorten the read access time and the cycle time. The result of the redundancy judgement carried out during the refresh operation is not transmitted to the word decoder part WDEC due to the operation of the latch circuit 32, until the access operation has been started. Therefore, it is possible to prevent the malfunction of the memory core 34 that carries out the refresh operation.

To be more specific, the fuses 38b for programming the address indicating the defected memory cell MC are provided in the redundancy judgement circuit 28. When the address programmed by the fuses 38b coincides with the row address signals RAD, the hit signal HITZ, and the redundancy address signal REDADX are output. The latch circuit 32 latches the hit signal HITZ and the redundancy address signal REDADX in synchronization with the start of each of the refresh operation and the access operation, and outputs the latched signals to the word decode part WDEC. Accordingly, if the redundancy judgement circuit 28 outputs the hit signal HITZ and the redundancy address signal REDADX during the refresh operation, it is possible to prevent the malfunction of the memory core 34 during the refresh operation.

When the access request conflicts with the refresh request and the refresh operation is first carried out, the core control circuit 24 outputs the refresh switch signal RFSW in response to the start of the refresh operation. Thus, the address switching circuit 16 can output the row address signals RAD which are to be supplied through the address terminals AD to the redundancy judgement circuit 28 during the refresh operation. As a result, the redundancy judgement circuit 28 can start the redundancy judgement of the row address signals RAD (external address) during the refresh operation.

Selecting the row block RBLK by use of the result of the redundancy judgement by the redundancy judgement circuit 28 makes it possible to easily separate the redundancy judgement operation for the access operation from the access operation. As a result, it is possible to easily carry out the redundancy judgement of the row address signals RAD during the refresh operation.

In the above-described embodiment, the present invention is applied to the clock-synchronous pseudo-SRAM. The present invention, however, is not limited to such an embodiment. If the present invention is applied to, for example, a clock-asynchronous pseudo-SRAM, the same effects can be obtained.

In the above-described embodiment, the present invention is applied to the pseudo-SRAM chip. The present invention, however, is not limited to such an embodiment. If the present invention is applied to, for example, a pseudo-SRAM core mounted on a system LSI, the same effects can be obtained.

The invention is not limited to the above embodiments and various modifications may be made without departing from the spirit and scope of the invention. Any improvement may be made in part or all of the components.

What is claimed is:

1. A semiconductor memory comprising:
   a memory core having a plurality of normal memory cells and at least one redundancy memory cell relieving a defected normal memory cell;
   an internal request generator periodically generating an internal access request;
   a command input circuit receiving an external access request supplied through an external terminal;
   an arbiter judging which of said internal access request and said external access request takes higher priority, when said internal access request conflicts with said external access request;
   a core control circuit making said memory core carry out internal access operation and external access operation in response to each of said internal access request and said external access request;
   a redundancy judgement circuit carrying out redundancy judgement in order of priority judged by said arbiter in response to each of said internal access request and said external access request, said redundancy judgement judging which is to be accessed between one of said normal memory cells and said redundancy memory cell, and said redundancy judgement circuit carrying out redundancy judgement corresponding to said external access request during said internal access operation in response to said internal access request, when said arbiter gives higher priority to said internal access request than said external access request; and
   a hold circuit holding judged result by said redundancy judgement circuit in synchronization with the start of each of said internal and external access operation, and outputting said judged result to said memory core.

2. The semiconductor memory according to claim 1, further comprising:
   an internal address generator generating an internal address which indicates the normal memory cell accessed in accordance with said internal access request;
   an address input circuit receiving an external address through an external terminal, said external address indicating the normal memory cell accessed in accordance with said external access request; and
   an address switching circuit selecting said internal address until said internal access operation is started, and selecting said external address and outputting the selected external address in response to the start of said internal access operation, when said arbiter gives higher priority to said internal access request than said external access request, and wherein
   said redundancy judgement circuit carries out said redundancy judgment in accordance with the address output from said address switching circuit.

3. The semiconductor memory according to claim 2, further comprising
   a predecoder predecoding an address output from said address switching circuit, and wherein
   said redundancy judgement circuit carries out said redundancy judgement in accordance with a predecode address output from said predecoder.

4. The semiconductor memory according to claim 2, wherein:
   said redundancy judgement circuit has a programming circuit programming an address indicating the defected normal memory cell;
   said programming circuit outputs a hit signal when the programmed address coincides with the address output from said address switching circuit;
   said hold circuit holds said hit signal in synchronization with the start of each of said internal and external access operation, and outputs the held hit signal to said memory core; and
   said memory core forbids access to the normal memory cell and accesses to said redundancy memory cell in response to said hit signal output from said hold circuit.

5. The semiconductor memory according to claim 2, wherein
   said redundancy judgment circuit has a plurality of programming circuits programming addresses indicating defected normal memory cells, said programming circuits being formed corresponding to the redundancy memory cells, respectively;
   each of said programming circuits outputs a hit signal and a predecoding signal indicating a corresponding redundancy memory cell, when the programmed address coincides with the address output from said address switching circuit;
   said hold circuit holds said hit signal and said predecoding signal in synchronization with the start of each of said internal and external access operation, and outputs the held hit signal and predecoding signal to said memory core; and
   said memory core forbids access to the normal memory cell and accesses to said redundancy memory cell corresponding to said predecoding signal, in response to said hit signal output from said hold circuit.

6. The semiconductor memory according to claim 5, wherein said memory core includes:
   a plurality of memory blocks each of which includes the normal memory cells and said redundancy memory cell; and
   a decode circuit selecting one of said memory blocks including the redundancy memory cell corresponding to said predecoding signal, in response to said hit signal and said predecoding signal supplied through said hold circuit.

7. The semiconductor memory according to claim 1, wherein
   the sum total of time necessary for said internal access operation and for said external access operation is equal to or shorter than external cycle time which is a minimum supply interval of said external access request.

* * * * *